United States Patent
Yokoyama

(10) Patent No.: US 7,408,143 B2
(45) Date of Patent: Aug. 5, 2008

(54) PREVIOUS AMPLIFIER CIRCUIT, LIGHT-RECEIVING AMPLIFIER CIRCUIT, AND OPTICAL PICKUP APPARATUS HAVING GROUNDED EMITTER AMPLIFIER CIRCUITS EACH WITH A GROUNDED EMITTER TRANSISTOR

(75) Inventor: Takashi Yokoyama, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 19 days.

(21) Appl. No.: 11/710,506

(22) Filed: Feb. 26, 2007

(65) Prior Publication Data

US 2007/0228260 A1    Oct. 4, 2007

(30) Foreign Application Priority Data

Mar. 30, 2006    (JP)    ............... 2006-095864

(51) Int. Cl.
*H01J 40/14*    (2006.01)
(52) U.S. Cl. ............... 250/214 R; 250/201.5
(58) Field of Classification Search ............ 250/214 R, 250/214 A, 214 LS, 201.5; 369/44.27–44.29, 369/44.34–44.36, 44.41–44.47, 44.54, 44.59; 330/59, 129, 130
See application file for complete search history.

(56) References Cited

U.S. PATENT DOCUMENTS 5,930,211 A * 7/1999 Sasaki .................. 369/44.29
7,002,881 B2   2/2006 Okuda et al.

FOREIGN PATENT DOCUMENTS

JP    2001-202646    7/2001

* cited by examiner

*Primary Examiner*—Que T Le
(74) *Attorney, Agent, or Firm*—Morrison & Foerster LLP

(57) ABSTRACT

A previous amplifier circuit of the present invention includes: a grounded emitter amplifier circuit using a grounded emitter transistor connected to a light receiving device; another grounded emitter amplifier circuit using another grounded emitter transistor connected to another light receiving device; and a grounded emitter changing switch to be switched in a manner such that an emitter of the grounded emitter transistors is grounded so as to cause only one of the grounded emitter amplifier circuits to operate. A light-receiving amplifier circuit includes the previous amplifier circuit. An optical pickup apparatus includes the light-receiving amplifier circuit.

15 Claims, 9 Drawing Sheets

PREVIOUS AMPLIFIER CIRCUIT, LIGHT-RECEIVING AMPLIFIER CIRCUIT, AND OPTICAL PICKUP APPARATUS HAVING GROUNDED EMITTER AMPLIFIER CIRCUITS EACH WITH A GROUNDED EMITTER TRANSISTOR

This Nonprovisional application claims priority under 35 U.S.C. § 119(a) on Patent Application No. 095864/2006 filed in Japan on Mar. 30, 2006, the entire contents of which are hereby incorporated by reference.

FIELD OF THE INVENTION

The present invention relates to a light-receiving amplifier circuit to be included in an optical pickup apparatus used in reproduction/recording with optical disks, and particularly relates to a previous amplifier circuit to be included in the light-receiving amplifier circuit.

BACKGROUND OF THE INVENTION

In the field of optical disks for recording sounds, images, and the like, a plurality of formats such as CD, DVD, and BD have been developed in recent years for the purpose of increasing recording capacity. This requires optical disk driving apparatuses for driving optical disks to be accommodated to optical disks of the plural formats. In view of the circumstance, there have been developed optical pickup apparatuses employing a package of two-wavelength laser device that emits laser light of two wavelength types (see publicly-known document 1 ("Japanese Unexamined Patent Publication No. 2004-22051 (published on Jan. 22, 2004)")).

FIG. 7 shows a configuration of an optical system in an optical pickup apparatus 101 employing a two-wavelength laser device.

The optical pickup apparatus 101 includes, as shown in the figure, a two-wavelength laser diode 103, a collimator lens 104, a beam splitter 105, an objective lens 107, a spot lens 108, and a light receiving amplification element 110.

Laser light emitted from the two-wavelength laser diode 103, which is a light emitting device serving as a light source for recording and reproduction, is changed into parallel light by the collimator lens 104. Thereafter, an optical path of the laser light thus changed is bent by 90° by the beam splitter 105, and then illuminates an optical disk 102 via the objective lens 107. Thereafter, light reflected from the optical disk 102 is converged by the spot lens 108 via the objective lens 107 and the beam splitter 105, and then comes incident on the light receiving amplification element 110. On the basis of incident light signals, the light receiving amplification element 110 reproduces information signals and generates focusing servo signals and/or focusing servo signals. The light receiving amplification element 110 then supplies a signal processing circuit (not illustrated), a control circuit (not illustrated), and the like with the signals thus reproduced and generated.

Meanwhile, the two-wavelength laser diode 103 emits laser light of two wavelength-types, depending upon the type of the optical disk 102 (in the present case, CD laser light having a wavelength of 780 nm and DVD laser light having a wavelength of 650 nm are emitted). In the two-wavelength laser diode 103, emission points from which the laser lights are emitted, respectively, are approximately 100 μm apart. In the optical pickup apparatus 101, a common optical system is used regardless of laser light. Therefore, in a same manner as the emission points in the two-wavelength laser diode 103, the laser lights come incident on locations that are approximately 100 μm apart, respectively, on the light receiving amplification element 110. Accordingly, in the case where the two-wavelength laser diode is employed, the light receiving amplification element needs to include a light receiving section for each laser light. In the present case, two light receiving sections, one for CD and the other one for DVD, need to be included.

FIG. 8 shows a light receiving section of the light receiving amplification element 110. As described above, light receiving sections (light receiving section 110A for DVD, and light receiving section 110B for CD) for the laser lights are provided, respectively. If, for example, a three-wavelength laser diode is developed in the future, obviously light receiving sections need to be included. Note that, as shown in the figure, each of the light receiving sections includes a main light-receiving section for information signals and a sub light-receiving section for tracking servo signals.

FIG. 9 shows a configuration of a light-receiving amplifier circuit 121 included in the light receiving amplification element 110. The light-receiving amplifier circuit 121, as shown in the figure, is configured with a previous amplifier circuit 122 and a following amplifier circuit 123.

The previous amplifier circuit 122, in the present case, includes two main light-receiving sections a (light receiving section for DVD) and A (light receiving section for CD), and an output changing switch S1 that causes an output of one of the main light-receiving sections a and A to be supplied to the following amplifier circuit 123.

The main light-receiving section a includes a photodiode PD1 and a trans impedance type amplifier circuit that is configured with an amplifier A1, which converts current generated in the photodiode PD1 into voltage and outputs the voltage, a feedback resistor R1, and a feedback capacitor C1. An anode of the photodiode PD1 is grounded. A cathode of the photodiode PD1 is connected to an input terminal of the amplifier A1. Further, the feedback resistor R1 and the feedback capacitor C1 are connected parallel to the amplifier A1. An output terminal of the amplifier circuit A1 is connected to the output changing switch S1.

The main light-receiving section A has a same configuration as the main light-receiving section a. The main light-receiving section A includes a photodiode PD2 and a trans impedance type amplifier circuit that is configured with an amplifier A2, which converts current generated in the photodiode PD2 into voltage and outputs the voltage, a feedback resistor R2, and a feedback capacitor C2. An anode of the photodiode PD2 is grounded. A cathode of the photodiode PD2 is connected to an input terminal of the amplifier A2. Further, the feedback resistor R2 and the feedback capacitor C2 are connected in parallel to the amplifier circuit A2. An output terminal of the amplifier circuit A2 is connected to the output changing switch S1.

The following amplifier circuit 123 includes an amplifier A3 and resistors R3 to R5.

One input terminal of the amplifier A3 is connected to one end of the resistor R3. The other end of the resistor R3 is connected to the output changing switch S1. One end of the resistor R4 is connected to a connection point of the one input terminal of the amplifier A3 and the one end of the resistor R3. The other end of the resistor R4 is connected to a terminal via which a reference voltage is externally supplied. The other input terminal of the amplifier A3 is connected to an output terminal of the amplifier A3 via the resistor R5. The output terminal of the amplifier A3 is an output terminal of the light-receiving amplifier circuit 121.

In the case where DVD laser light is emitted from the two-wavelength laser diode 103, reflected light from the optical disk 102 is supplied to the main light-receiving section a, and then converted from current into voltage. At this time, the output changing switch S1 is switched in a manner such that an output of the main light-receiving section a is supplied to the following amplifier circuit 123. Therefore, the output of the main light-receiving section a is supplied to the following amplifier circuit 123, amplified at the following amplifier circuit 123, and then outputted.

On the other hand, in the case where CD laser light is emitted from the two-wavelength laser diode 103, reflected light from the optical disk 102 is supplied to the main light-receiving section A, and then converted from current into voltage. An output of the main light-receiving section A is supplied to the following amplifier circuit 123 via the output changing switch S1, which is switched in a manner such that an output of the main light-receiving section A is supplied to the following amplifier circuit 123. Thereafter, the output of the main light-receiving section A is amplified at the following amplifier circuit 123 and then outputted.

Note that, concretely, the amplifier A1 of the main light-receiving section a is configured with a differential amplifier circuit that amplifies a difference between an output of the photodiode PD1 and the reference voltage supplied externally, and then outputs the difference thus amplified. In a same manner, the amplifier A2 of the main light-receiving section A is configured with a differential amplifier circuit that amplifies a difference between an output of the photodiode PD2 and the reference voltage supplied externally, and then outputs the difference thus amplified.

Meanwhile, to allow the light-receiving amplifier circuit 121, which is capable of accommodating the two-wavelength laser diode, to be included in an optical pickup apparatus for high-speed reproduction/recording, improvement in response frequency characteristics, output offset voltage, and output noise characteristics is required. To improve these respective characteristics, it is effective that each of the amplifiers A1 and A2, which is conventionally configured with a differential amplifier circuit, is configured with a grounded emitter amplifier circuit. The following describes reasons therefor.

First, the response frequency characteristics will be described, with reference to FIG. 10.

FIG. 10 shows response frequency characteristics of the respective amplifiers A1 and A2. Note that the response frequency characteristics of the respective amplifiers A1 and A2 are decided in accordance with formula (1) below:

$$fc=1/(2\pi RC) \text{ (Hz)} \quad (1)$$

where R is a resistance of the feedback resistor R1 (or feedback resistor R2), and C is a capacitance of the feedback capacitor C1 (or feedback capacitor C2). Further, the feedback circuit in the figure corresponds to the feedback resistor R1 and the feedback capacitor C1 in the amplifier A1, and the feedback resistor R2 and the feedback capacitor C2 in the amplifier A2.

As shown in the figure, the amplifiers A1 and A2 have different response frequency characteristics from each other. Thus, limits of response frequencies as a result of feedback become frequencies f1 and f2, respectively.

At this time, even if the feedback capacitor C1 is set small in order to improve the response frequency characteristics of the amplifier A1, it is not possible to obtain a response equal to or greater than a certain frequency because the amplifier A1 is configured with a differential amplifier circuit (because the response frequency characteristics are slow in the case of open-loop). This is the same in the amplifier A2. Therefore, to improve the response frequency characteristics of the light-receiving amplifier circuit 121, it is required to set the feedback resistor R1 (or feedback resistor R2) small, or to improve the response frequency characteristics of the amplifiers in the case of open-loop.

Next, the following describes the output offset voltage. The output offset voltage is voltage that is outputted when no input signal is supplied to the light receiving section (when no reflected is supplied light from the optical disk 102).

It is ideal that the output offset voltage matches with the reference voltage supplied externally to the following amplifier circuit 123. However, an offset voltage is generated in the previous amplifier circuit 122 due to manufactural deviation and the like. The output offset voltage of the light-receiving amplifier circuit 121 is voltage generated at the following amplifier circuit 123 by amplifying the offset voltage of the previous amplifier circuit 122. Therefore, to restrain deviation in the output offset voltage, it is effective to reduce a gain of the following amplifier circuit 123.

Next, the following describes the output noise characteristics. In a same manner as the output offset voltage, it is effective with respect to the output noise characteristics to reduce a gain of the following amplifier circuit 123, because noise generated at the previous amplifier circuit 122 is amplified at the following amplifier circuit 123.

As described above, to improve the respective characteristics of the light-receiving amplifier circuit 121, it is required to improve the response frequency characteristics of the amplifiers, included in the previous amplifier circuit 122, in the case of open-loop, and to set a gain of the previous amplifier circuit 122 greater, as much as possible, than the gain of the following amplifier circuit 123.

Meanwhile, the grounded emitter amplifier circuit has excellent response frequency characteristics in the case of open-loop, and a characteristic of a wide dynamic range of outputs. Therefore, to improve the respective characteristics, it is effective that each of the amplifiers of the previous amplifier circuit 122 is configured with the grounded emitter amplifier circuit.

FIG. 11 shows an exemplary circuit in which the previous amplifier circuit is actually configured with a grounded emitter amplifier circuit.

A previous amplifier circuit 5 is configured with the photodiode PD1 (light receiving device), an grounded emitter amplifier circuit 1, an active load and bias circuit 2 of the grounded emitter amplifier circuit 1, an output circuit 3 configured with an emitter follower circuit, a feedback resistor R31, and a feedback capacitor C31.

The grounded emitter amplifier circuit 1 includes an NPN-type transistor (grounded emitter transistor) Q1. The active load and bias circuit 2 of the grounded emitter amplifier circuit 1 include PNP-type transistors Q3 and Q5, resistors R1 and R2, and a constant-current source I2. The output circuit 3 includes an NPN-type transistor Q4 and a constant-current source I1.

In the active load and bias circuit 2 of the grounded emitter amplifier circuit 1, a base of the transistor Q3 and a base of the transistor Q5 are connected. The base of the transistor Q5 is connected to a collector of the transistor Q5. The collector of the transistor Q5 is grounded via the constant-current source I2.

An emitter of the transistor Q3 is connected to one end of the resistor R2. An emitter of the transistor Q5 is connected to one end of the resistor R1. The other end of the resistor R1 and the other end of the resistor R2 are connected to a power supply Vcc.

An anode of the photodiode PD1 is grounded. A cathode of the photodiode PD1 is connected to a base of the transistor Q1. A collector of the transistor Q1 is connected to a collector of the transistor Q3. A connection point of the collector of the transistor Q1 and the collector of the transistor Q3 is connected to a base of the transistor Q4.

A collector of the transistor Q4 is connected to the power supply Vcc. An emitter of the transistor Q4 is grounded via the constant-current source I1. The feedback resistor R31 and the feedback capacitor C31, which is connected in parallel to the feedback resistor R31, are connected across the base of the transistor Q1 and a connection point of the emitter of the transistor Q4 and the constant-current source I1. The base of the transistor Q1 is an input terminal of the previous amplifier circuit 5. The connection point of the emitter of the transistor Q4 and the constant-current source I1 is an output terminal Vo of the previous amplifier circuit 5.

Meanwhile, to allow the previous amplifier circuit 5 configured with the grounded emitter amplifier circuit as described above to be included as the previous amplifier circuit 122, which is capable of accommodating a two-wavelength laser diode, of the light-receiving amplifier circuit 121 of the conventional technique described above, it is necessary to include two light receiving sections. In order to do so, it is necessary to include a plurality of the circuit surrounded by the dashed-dotted line in FIG. 11. This causes a big problem of increase in the number of elements. Note that a conventional technique is found in publicly-known Document 2 ("Japanese Unexamined Patent Publication No. 2001-202646 (published on Jul. 27, 2001)").

SUMMARY OF THE INVENTION

The present invention is in view of the above problems, and has as an object to realize: a previous amplifier circuit that is configured with a grounded emitter amplifier circuit so as to keep the number of elements constituting the circuit to a minimum even in the case where a plurality of light receiving sections are included; a light-receiving amplifier circuit including the previous amplifier circuit; and an optical pickup apparatus including the light-receiving amplifier circuit.

To achieve the above object, a previous amplifier circuit according to the present invention includes: a plurality of light receiving devices, each receiving a light signal, converting the light signal into current, and outputting the current, the light signal being incident on only one of the plurality of light receiving devices; a plurality of grounded emitter amplifier circuits, each amplifying, by use of a grounded emitter transistor, the current thus outputted and outputting the current thus amplified, the plurality of grounded emitter amplifier circuits being provided one by one for the plurality of light receiving devices; a first switch to be switched in a manner such that an emitter of a grounded emitter transistor connected to a light receiving device on which the light signal is incident is grounded so as to cause only one of the plurality of grounded emitter amplifier circuits to operate; an active load of the plurality of grounded emitter amplifier circuits; and an output circuit to receive an output of the plurality of grounded emitter amplifier circuits, and to produce an output by use of an emitter follower.

In the above configuration, the previous amplifier circuit according to the present invention includes the first switch. The first switch causes only one of the grounded emitter amplifier circuits to operate. Therefore, none of the grounded emitter amplifier circuits operates simultaneously with the other grounded emitter amplifier circuits. This allows the plurality of grounded emitter amplifier circuits to share the active load and the output circuit. Accordingly, a previous amplifier circuit is realized that allows the number of elements constituting the circuit to be kept to a minimum even in the case where the previous amplifier circuit is configured with the grounded emitter amplifier circuit and includes a plurality of light receiving sections. This is an advantage of the present invention.

Further, the following discusses the case in which: the number of the light receiving devices is two, the first light receiving device and the second light receiving device; and the grounded emitter amplifier circuit connected to the first light receiving device is the first grounded emitter amplifier circuit, and the grounded emitter amplifier circuit connected to the second light receiving device is the second grounded emitter amplifier circuit.

In this case, when the light signal is incident on the first light receiving device, and unnecessary stray light is incident on the second light receiving device, the first switch is switched in a manner such that the emitter of the grounded emitter transistor included in the first grounded emitter amplifier circuit is grounded so as to cause only the first grounded emitter amplifier circuit to operate. In other words, the second grounded emitter amplifier circuit does not operate. Thus, the unnecessary stray light incident on the second light receiving device does not affect an output of the previous amplifier circuit, which output is based upon the light signal.

This produces an advantage, in addition to the above advantages, that only an output based upon the light signal is outputted from the previous amplifier circuit even when unnecessary stray light is incident on a light receiving device other than the light receiving device on which the light signal is incident.

The light-receiving amplifier circuit according to the present invention includes the previous amplifier circuit.

In the above configuration, the light-receiving amplifier circuit according to the present invention includes the previous amplifier circuit. This makes it possible to keep the number of elements constituting the circuit to a minimum. Furthermore, influence by unnecessary stray light is prevented.

Further, the previous amplifier circuit is configured with a grounded emitter amplifier circuit. Therefore, the light-receiving amplifier circuit has excellent characteristics in response frequency characteristics, output offset voltage, and output noise characteristics. Accordingly, an advantage is produced that use of the light-receiving amplifier circuit as an optical pickup apparatus for high-speed reproduction/recording is significantly effective.

An optical pickup apparatus according to the present invention includes the light-receiving amplifier circuit.

In the above configuration, the optical pickup apparatus according to the present invention includes the light-receiving amplifier circuit. This produces the following advantages: the optical pickup apparatus allows the number of elements constituting the circuit to be kept to a minimum; influence by unnecessary stray light is prevented; and the optical pickup apparatus is suitable to be used as an optical pickup apparatus for high-speed reproduction/recording.

Additional objects, features, and strengths of the present invention will be made clear by the description below. Further, the advantages of the present invention will be evident from the following explanation in reference to the drawings.

DESCRIPTION OF THE EMBODIMENTS

In the following description, a previous amplifier circuit described in respective embodiments below is included, as the previous amplifier circuit 122 discussed above in the description of the conventional technique, in a light-receiving amplifier circuit 121. Further, the light-receiving amplifier circuit 121 is included in a light receiving amplification element 110 of an optical pickup apparatus 101.

Embodiment 1

Figure 1:
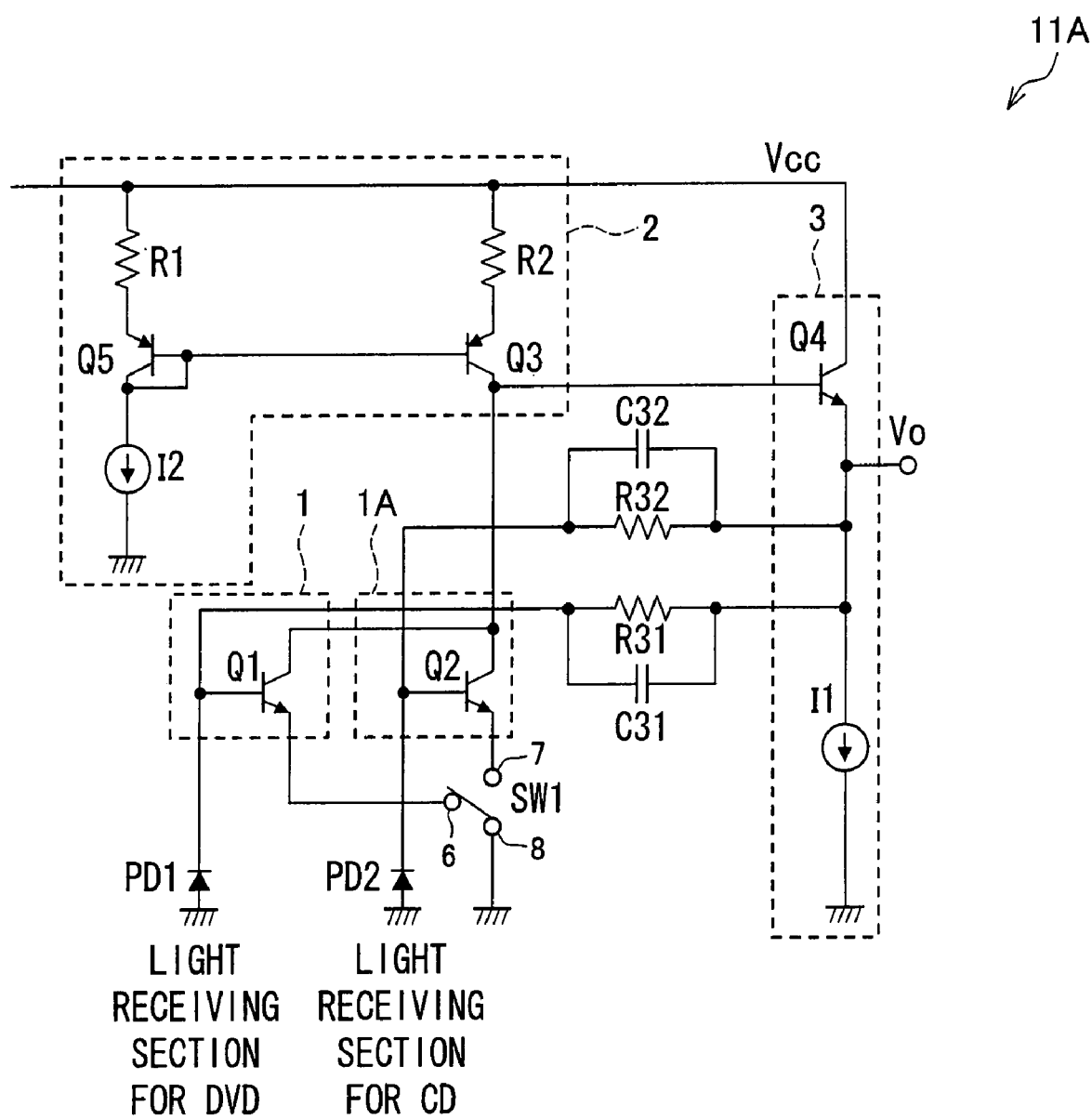
FIG. 1 is a circuit diagram illustrating a configuration of a previous amplifier circuit, according to an embodiment.
Figure 2:
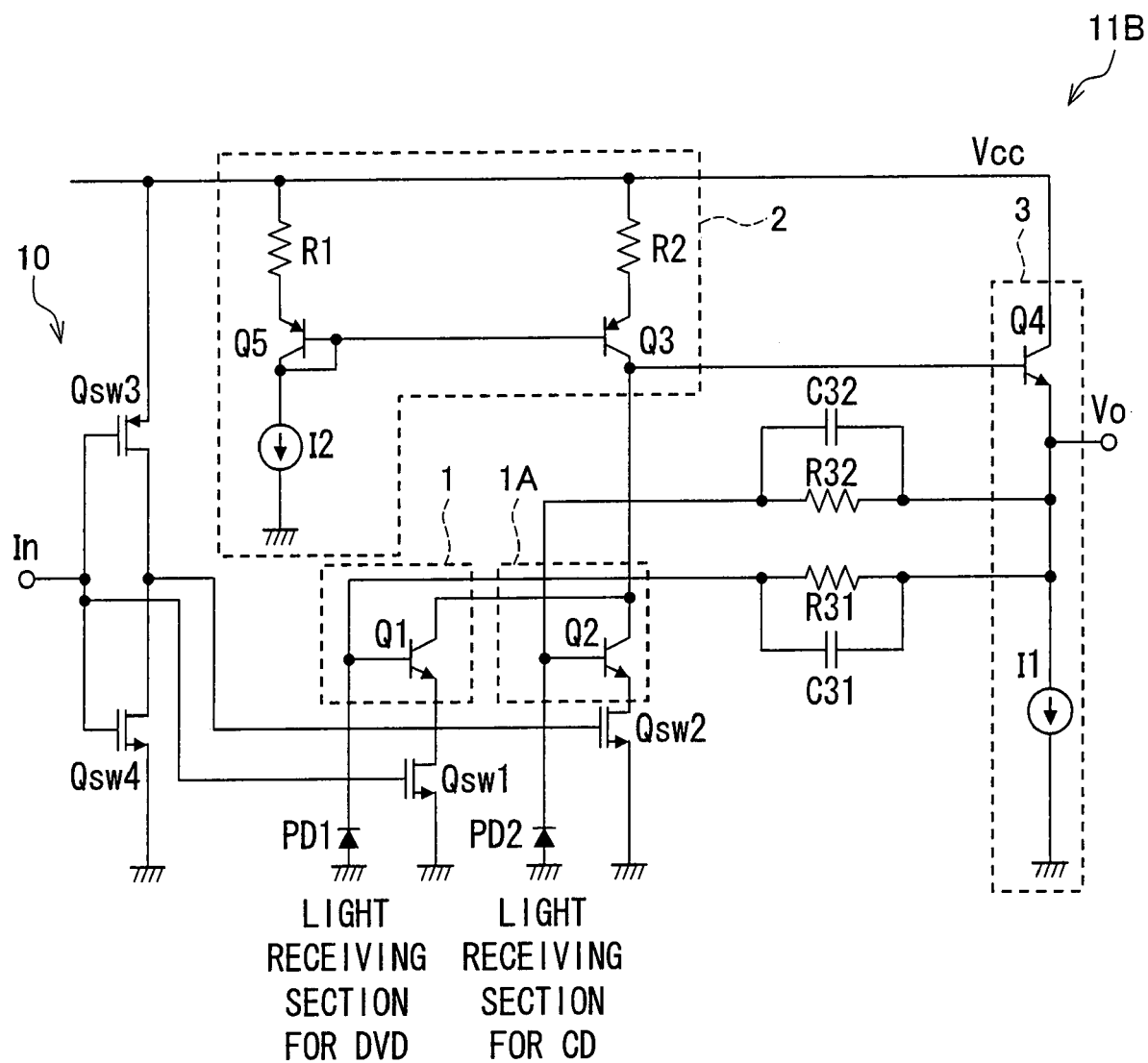
FIG. 2 is a circuit diagram illustrating another configuration of the previous amplifier circuit.

The following describes an embodiment of the present invention, with reference to FIGS. 1 and 2.

Figure 11:
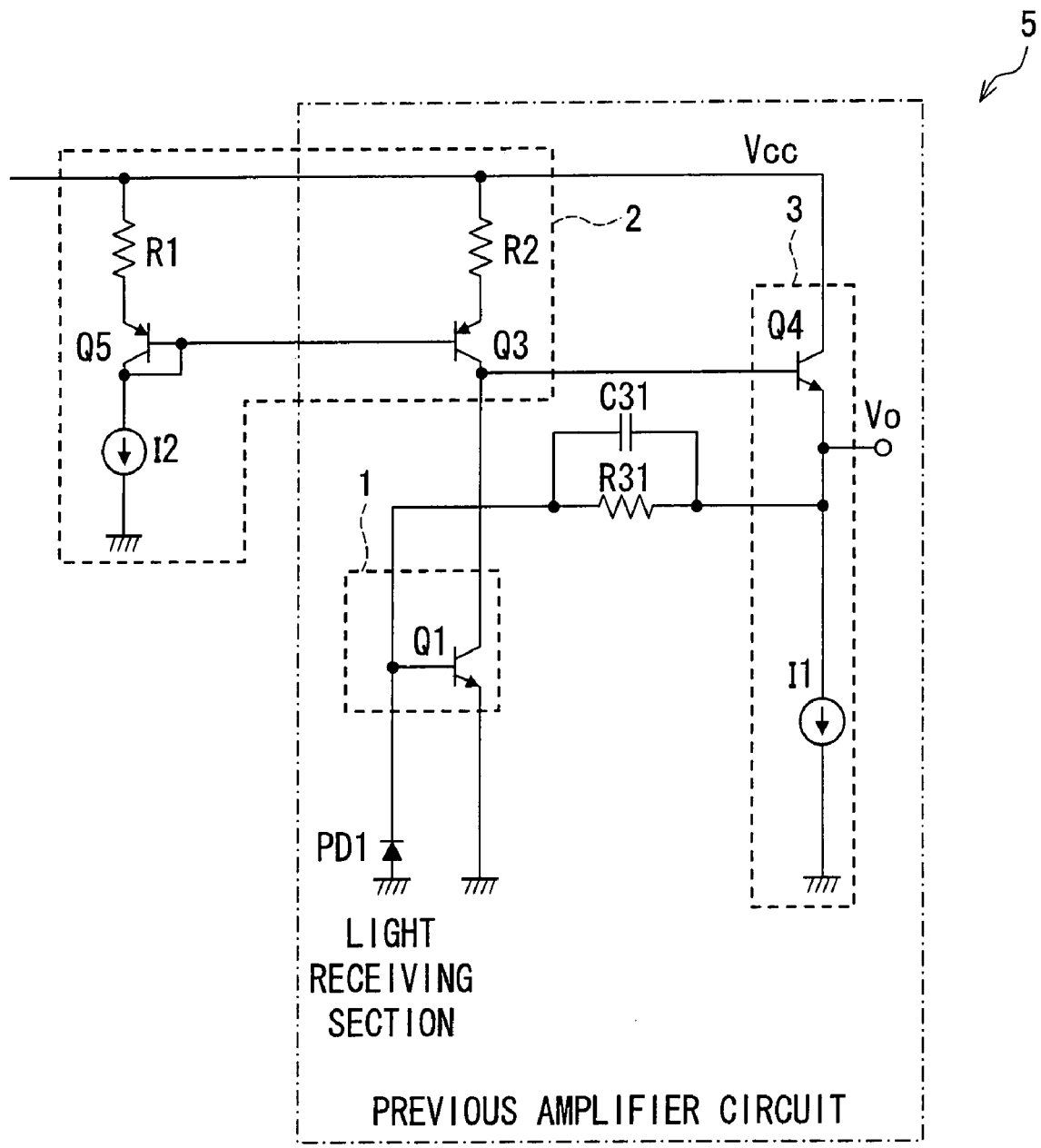
FIG. 11 is a circuit diagram illustrating a previous amplifier circuit included in the light-receiving amplifier circuit, in the case where the previous amplifier circuit is configured with a grounded emitter amplifier circuit.

FIG. 1 shows a configuration of a previous amplifier circuit 11A according to the present embodiment. Note that components given the same reference numerals as those of the previous amplifier circuit 5 shown in FIG. 11 have the same functions as those of the previous amplifier circuit 5. No particular description will be made on circuit configurations and connection relationships thereof.

The previous amplifier circuit 11A includes, in addition to the configuration of the previous amplifier circuit 5, a photodiode PD2 (light receiving device), a grounded emitter amplifier circuit 1A, a grounded emitter changing switch SW1 (first switch) (double throw switch), a feedback resistor R32, and a feedback capacitor C32. The previous amplifier circuit 11A converts current generated in the photodiodes PD1 and PD2 into voltage and then outputs the voltage.

The grounded emitter amplifier circuit 1A includes an NPN-type transistor (grounded emitter transistor) Q2. An anode of the photodiode PD2 is grounded. A cathode of the photodiode PD2 is connected to a base of the transistor Q2. A collector of the transistor Q2 is connected to a collector of a transistor Q3. An emitter of the transistor Q2 is connected to a terminal 7 of the grounded emitter changing switch SW1. A terminal 6 of the grounded emitter changing switch SW1 is connected to an emitter of a transistor Q1. A terminal 8 of the grounded emitter changing switch SW1 is grounded.

The feedback resistor R32 and the feedback capacitor C32, which is connected in parallel to the feedback resistor R32, are connected across the base of the transistor Q2 and a connection point of a constant-current source I1 and an emitter of a transistor Q4. A feedback resistor R31, the feedback resistor R32, a feedback capacitor C31, and the feedback capacitor C32 are designed in a manner such that a desired sensitivity is obtained in respective light receiving sections. Each of a base of the transistor Q1 and the base of the transistor Q2 is an input terminal of the previous amplifier circuit 11A. The connection point of the constant-current source I1 and the emitter of the transistor Q4 is an output terminal Vo of the previous amplifier circuit 11A.

In the case where DVD laser light is emitted from a two-wavelength laser diode 103 of the optical pickup apparatus 101, reflected light from an optical disk 102 is supplied to a photodiode PD1 (light receiving device for DVD). At this time, the grounded emitter changing switch SW1 is switched in a manner such that the terminal 6, i.e. the emitter of the transistor Q1 of the grounded emitter amplifier circuit 1 is grounded. Accordingly, current generated in the photodiode PD1 is converted into voltage, and then the voltage is outputted from the output terminal Vo. Thereafter, the voltage is supplied to a following amplifier circuit 123 of the light-receiving amplifier circuit 121.

On the other hand, in the case where CD laser light is emitted from the two-wavelength laser diode 103, reflected light from the optical disk 102 is supplied to the photodiode PD2 (light receiving device for CD). At this time, the grounded emitter changing switch SW1 is switched in a manner such that the terminal 7, i.e. the emitter of the transistor Q2 of the grounded emitter amplifier circuit 1A is grounded. Accordingly, current generated in the photodiode PD2 is converted into voltage, and then the voltage is outputted from the output terminal Vo. Thereafter, the voltage is supplied to the following amplifier circuit 123 of the light-receiving amplifier circuit 121.

As described above, the previous amplifier circuit 11A includes the grounded emitter changing switch SW1. The grounded emitter changing switch SW1 is switched in a manner such that, depending upon a type of laser light emitted from the two-wavelength laser diode 103, either of the emitters of the transistors Q1 and Q2 is grounded so as to cause only one of the grounded emitter amplifier circuits 1 and 1A to operate.

This prevents the grounded emitter amplifier circuits 1 and 1A from operating at the same time, and therefore allows the grounded emitter amplifier circuits 1 and 1A to share the active load and bias circuit 2 and the output circuit 3. Therefore, even in the case where the previous amplifier circuit is configured with the grounded emitter amplifier circuit, and a plurality of light receiving sections are included, it is possible to keep the number of devices constituting the circuit to a minimum.

Further, for example when unnecessary stray light is incident on the photodiode PD2 while the photodiode PD1 is in operation (when light reflected from the optical disk 102 is supplied to the photodiode PD1), only the grounded emitter amplifier circuit 1 is operable because, as described above, the grounded emitter changing switch SW1 is switched so as to be connected to the terminal 6. Thus, the unnecessary stray light incident on the photodiode PD2 does not affect an output of the previous amplifier circuit 11A, which output is based upon current generated in the photodiode PD1.

This enables the previous amplifier circuit 11A to produce only an output based upon current generated in a photodiode PD that is in operation, even when unnecessary stray light is incident on a photodiode PD other than the photodiode PD that is in operation.

The following describes another exemplary configuration of the grounded emitter changing switch SW1, with reference to FIG. 2.

FIG. 2 shows a configuration of a previous amplifier circuit 11B according to the present embodiment. Note that components given the same reference numerals as those of the previous amplifier circuit 11A shown in FIG. 1 have the same functions as those of the previous amplifier circuit 11A. No particular description will be made on circuit configurations and connection relationships thereof.

In the previous amplifier circuit 11B, the grounded emitter changing switch SW1 of the previous amplifier circuit 11A is replaced by a MOS transistor. Specifically, a CMOS inverter 10 configured with a p-channel type MOS transistor Qsw3 and an n-channel type MOS transistor Qsw4 is further included, and the grounded emitter changing switch SW1 of the previous amplifier circuit 11A is configured with n-channel type MOS transistors Qsw1 and Qsw2.

The emitter of the transistor Q1 is connected to a drain of the MOS transistor Qsw1. A source of the MOS transistor Qsw1 is grounded. A gate of the MOS transistor Qsw1 is connected to an input terminal In of the CMOS inverter 10.

The emitter of the transistor Q2 is connected to a drain of the MOS transistor Qsw2. A source of the MOS transistor Qsw2 is grounded. A gate of the MOS transistor Qsw2 is connected to an output terminal of the CMOS inverter 10.

In the case where DVD laser light is emitted from the two-wavelength laser diode 103, the input terminal In of the CMOS inverter 10 is supplied with a voltage (Vcc voltage) of H (HIGH) level. This causes the MOS transistor Qsw1 to become ON. Further, the MOS transistor Qsw3 becomes OFF, and the MOS transistor Qsw4 becomes ON. As a result, the MOS transistor Qsw2 becomes OFF.

On the other hand, in the case where CD laser light is emitted from the two-wavelength laser diode 103, the input terminal In of the CMOS inverter 10 is supplied with a voltage (GND voltage) of L (LOW) level. This causes the MOS transistor Qsw1 to become OFF. Further, the MOS transistor Qsw3 becomes ON, and the MOS transistor Qsw4 becomes OFF. As a result, the MOS transistor Qsw2 becomes ON.

By performing the foregoing operations, the MOS transistors Qsw1 and Qsw2 and the CMOS inverter 10 collectively function as the grounded emitter changing switch SW1. In the present embodiment, the grounded emitter changing switch SW1 is configured with the MOS transistor. However, the grounded emitter changing switch SW1 is not limited to this configuration, and may be configured with a bipolar transistor, for example. Further, the grounded emitter changing switch SW1 may be not only the electrical switch as described above but also a mechanical switch.

Embodiment 2

Figure 3:
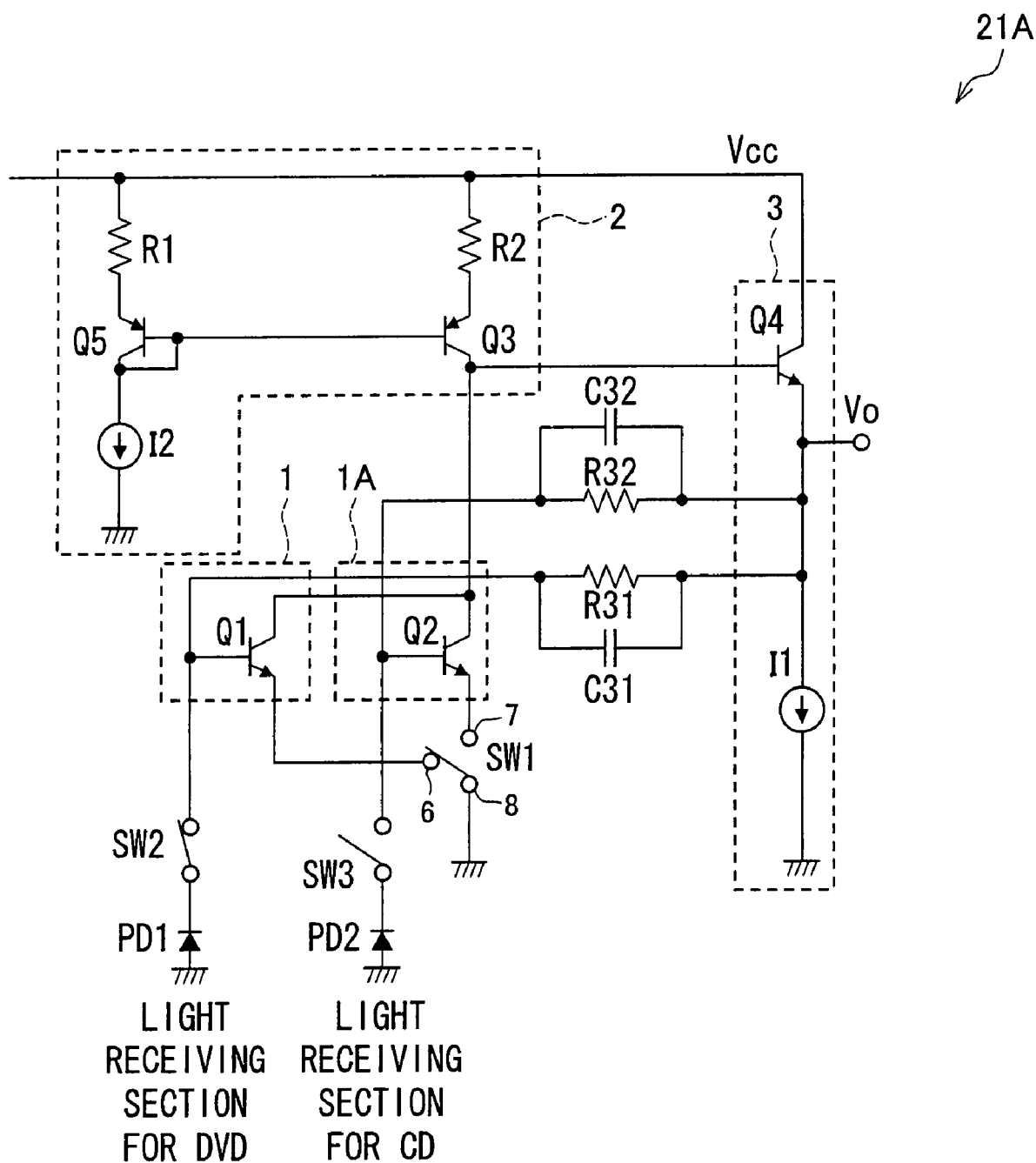
FIG. 3 is a circuit diagram illustrating another configuration of the previous amplifier circuit.
Figure 4:
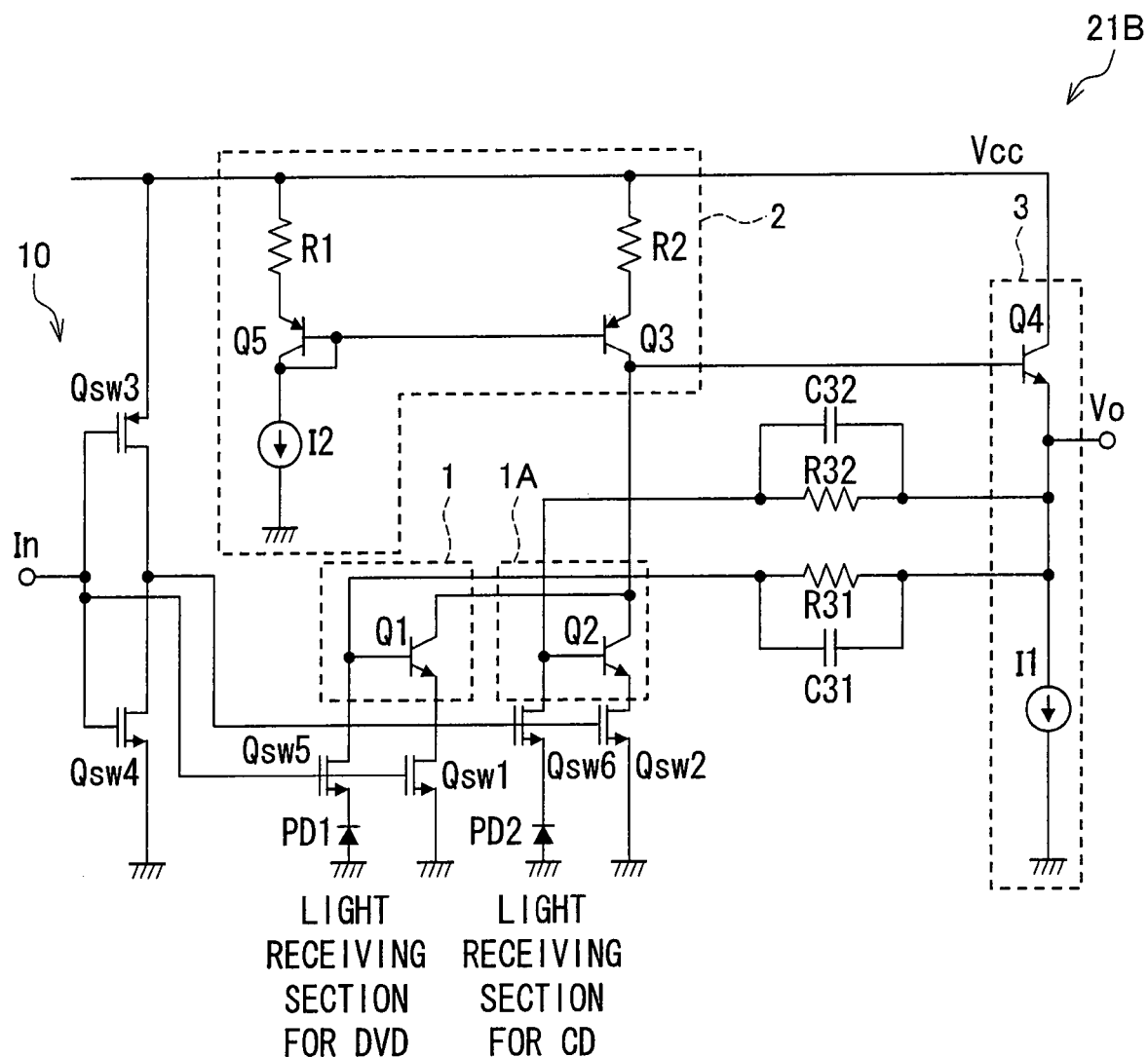
FIG. 4 is a circuit diagram illustrating another configuration of the previous amplifier circuit.

The following describes an embodiment of the present invention, with reference to FIGS. 3 and 4.

FIG. 3 shows a configuration of a previous amplifier circuit 21A according to the present embodiment. Note that components given the same reference numerals as those of the previous amplifier circuit 11A shown in FIG. 1 have the same functions as those of the previous amplifier circuit 11A. No particular description will be made on circuit configurations and connection relationships thereof.

The previous amplifier circuit 21A includes, in addition to the configuration of the previous amplifier circuit 11A, light receiving device changing switches SW2 and SW3 (second switch) (opening and closing device). In response to operation of a grounded emitter changing switch SW1 of the previous amplifier circuit 11A, the light receiving device changing switch SW2 causes a change in a state of connection between a photodiode PD1 and the grounded emitter amplifier circuit 1, and the light receiving device changing switch SW3 causes a change in a state of connection between a photodiode PD2 and the grounded emitter amplifier circuit 1A.

The switch SW2 is connected across the cathode of the photodiode PD1 and a base of a transistor Q1. The switch SW3 is connected across the cathode of the photodiode PD2 and a base of a transistor Q2.

In the case where the grounded emitter changing switch SW1 is switched so as to be connected to the terminal 6 of the grounded emitter changing switch SW1, the light receiving device changing switch SW2 is closed, and the light receiving device changing switch SW3 is opened. Accordingly, the grounded emitter amplifier circuit 1 is operable, and the photodiode PD1 and the grounded emitter amplifier circuit 1 are connected.

On the other hand, in the case where the grounded emitter changing switch SW1 is switched so as to be connected to the terminal 7 of the grounded emitter changing switch SW1, the light receiving device changing switch SW2 is opened, and the light receiving device changing switch SW3 is closed. Accordingly, the grounded emitter amplifier circuit 1A is operable, and the photodiode PD2 and the grounded emitter amplifier circuit 1A are connected.

As described above, the previous amplifier circuit 21A includes the grounded emitter changing switch SW1 and the light receiving device changing switches SW2 and SW3. This makes it possible to switch not only operations of the grounded emitter amplifier circuits 1 and 1A but also connections between the photodiodes PD and the grounded emitter amplifier circuits. Thus, even when unnecessary stray light is incident on a photodiode PD other than the photodiode PD that is in operation, it is possible to more assuredly produce only an output based upon current generated in a photodiode PD that is in operation than the previous amplifier circuit 11A does.

The following describes another exemplary configuration of the grounded emitter changing switch SW1 and the light receiving device changing switches SW2 and SW3, with reference to FIG. 4.

FIG. 4 shows a configuration of a previous amplifier circuit 21B according to the present embodiment. Note that components given the same reference numerals as those of the previous amplifier circuit 11B shown in FIG. 2 have the same functions as those of the previous amplifier circuit 11B. No particular description will be made on circuit configurations and connection relationships thereof.

In the previous amplifier circuit 21B, the light receiving device changing switch SW2 of the previous amplifier circuit 21A is configured with an n-channel type MOS transistor Qsw5, and the light receiving device changing switch SW3 is configured with an n-channel type MOS transistor Qsw6. Note that the grounded emitter changing switch SW1 has the same configuration as the previous amplifier circuit 11B.

A source of the MOS transistor Qsw5 is connected to the cathode of the photodiode PD1. A drain of the MOS transistor Qsw5 is connected to the base of the transistor Q1. A gate of the MOS transistor Qsw5 is connected to the input terminal In of the CMOS inverter 10. A source of the MOS transistor Qsw6 is connected to the cathode of the photodiode PD2. A drain of the MOS transistor Qsw6 is connected to the base of the transistor Q2. A gate of the MOS transistor Qsw6 is connected to an output terminal of the CMOS inverter 10.

In the case where DVD laser light is emitted from a two-wavelength laser diode 103, the input terminal In of the CMOS inverter 10 is supplied with a voltage of H level. This causes an MOS transistor Qsw1 and the transistor Qsw5 to become ON. Further, an MOS transistor Qsw3 becomes OFF, and an MOS transistor Qsw4 becomes ON. As a result, each of MOS transistors Qsw2 and Qsw6 becomes OFF.

On the other hand, in the case where CD laser light is emitted from the two-wavelength laser diode 103, the input terminal In is supplied with a voltage of L level. This causes each of the MOS transistors Qsw1 and Qsw5 to become OFF. Further, the MOS transistor Qsw3 becomes ON, and the MOS transistor Qsw4 becomes OFF. As a result, each of the MOS transistors Qsw2 and Qsw6 becomes ON.

By performing the foregoing operations, the CMOS inverter 10 and the MOS transistors Qsw1 and Qsw2, the MOS transistor Qsw5, and the MOS transistor Qsw6 function as the grounded emitter changing switch SW1 and the light receiving device changing switches SW2 and SW3, respectively. In the present embodiment, the grounded emitter changing switch SW1 and the light receiving device changing switch SW2 and SW3 are configured with the MOS transistors, respectively. However, each of the grounded emitter changing switch SW1 and the light receiving device changing switch SW2 and SW3 is not limited to the configuration, and may be configured with a bipolar transistor, for example. Further, each of the grounded emitter changing switch SW1 and the light receiving device changing switch SW2 and SW3 may be not only the electrical switch as described above but also a mechanical switch.

Embodiment 3

Figure 5:
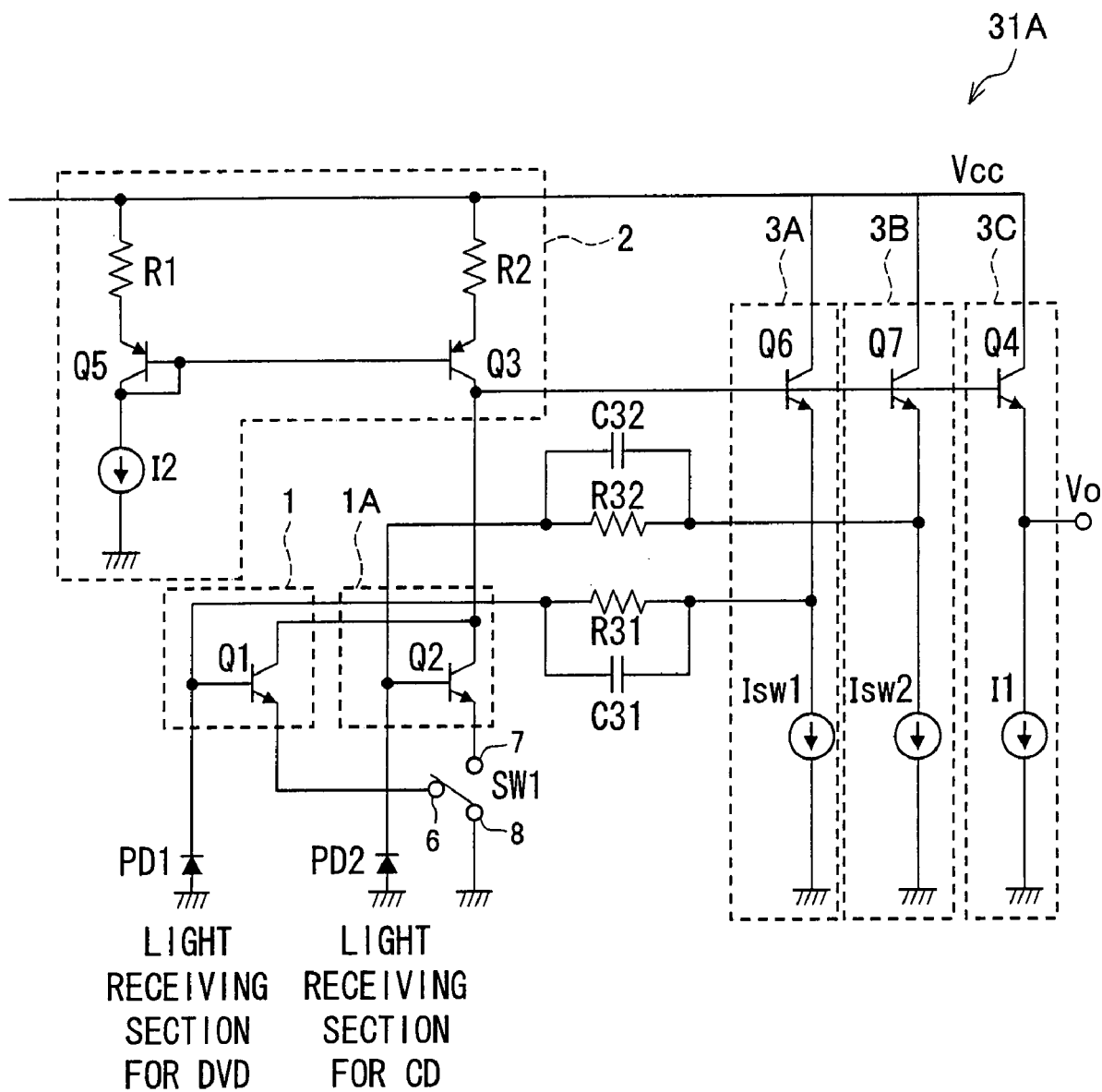
FIG. 5 is a circuit diagram illustrating another configuration of the previous amplifier circuit.
Figure 6:
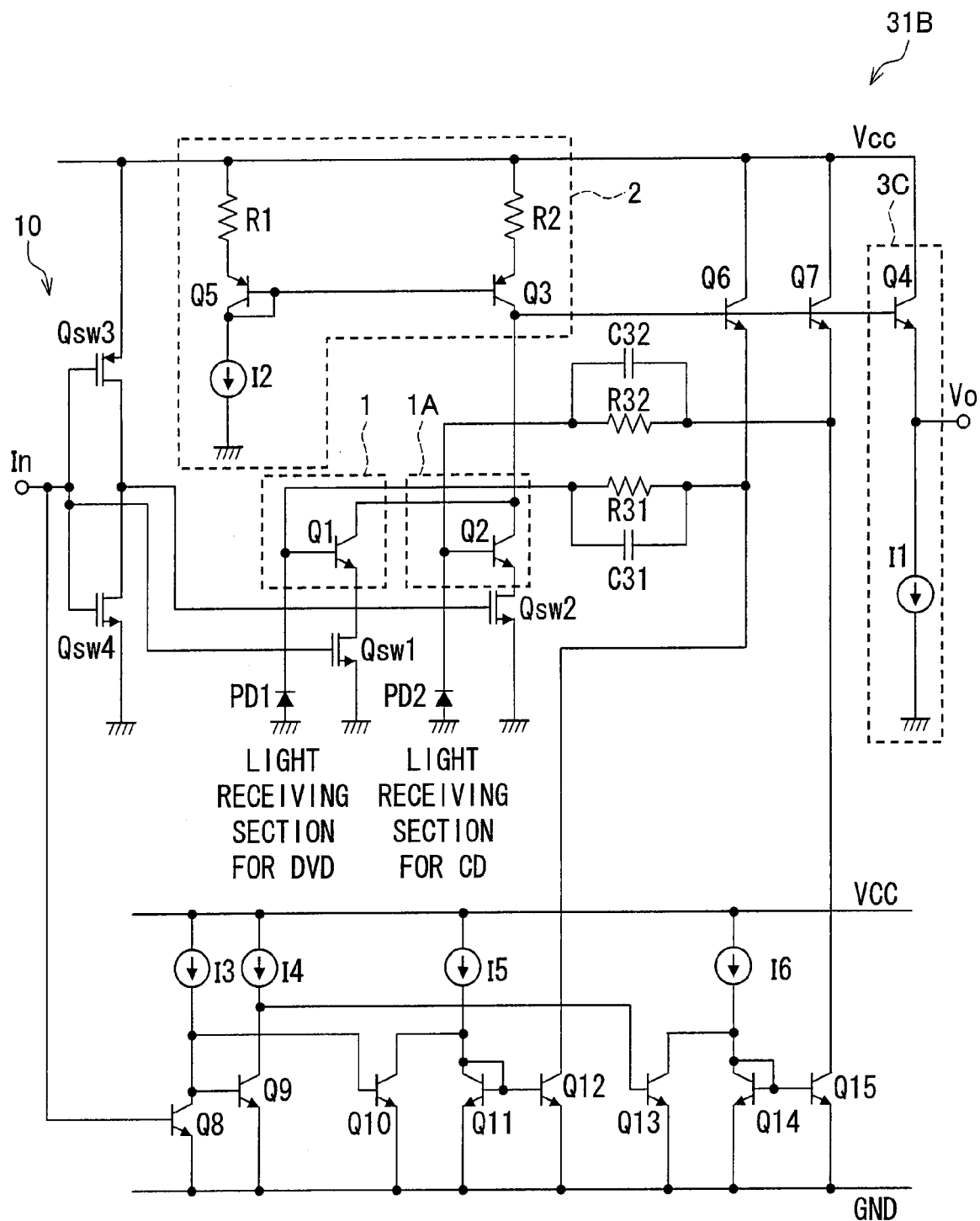
FIG. 6 is a circuit diagram illustrating another configuration of the previous amplifier circuit.
Figure 7:
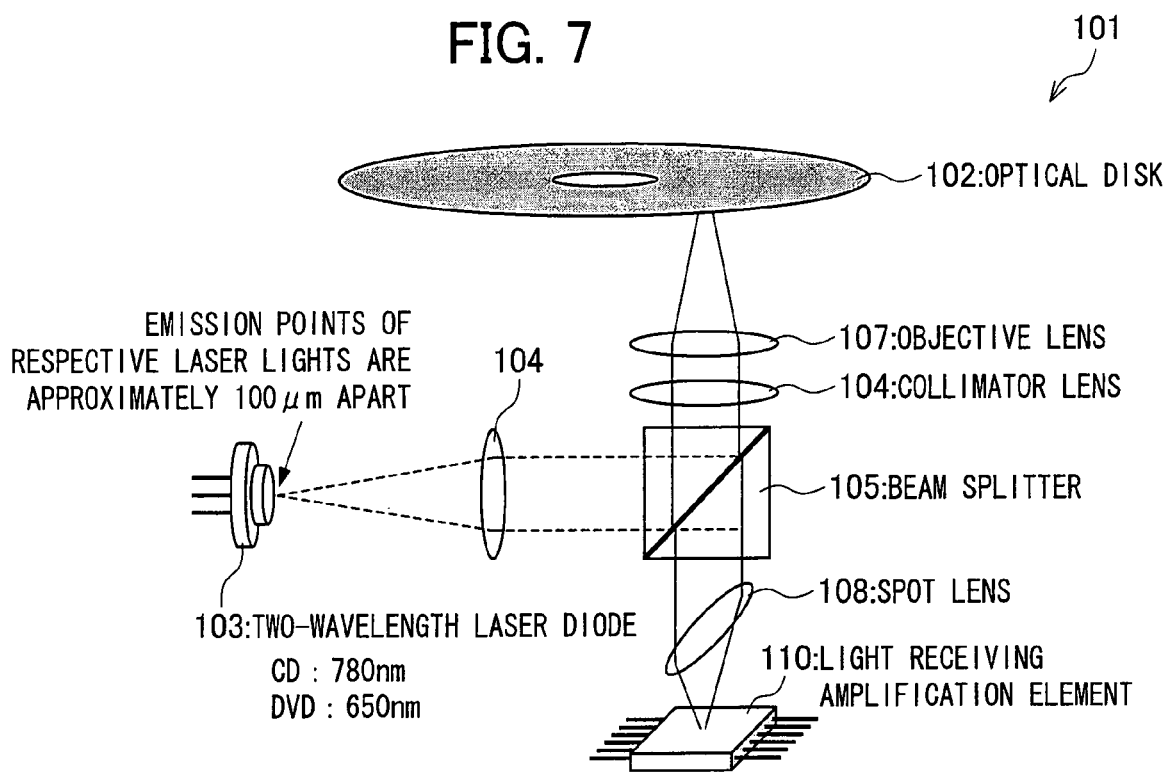
FIG. 7 is a diagram illustrating a configuration of an optical pickup apparatus, according to a conventional technique.
Figure 8:
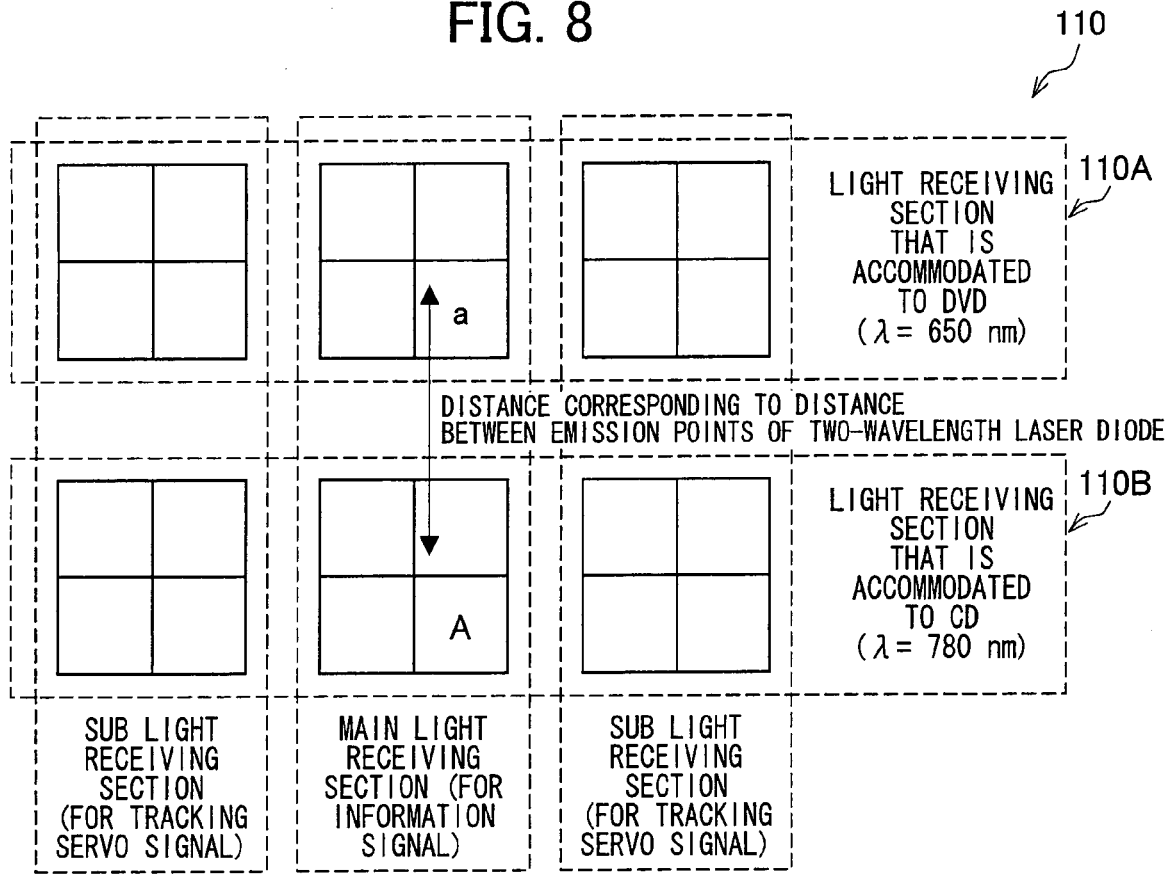
FIG. 8 is a diagram illustrating a light receiving section of a light receiving amplification element included in the optical pickup apparatus.

The following describes an embodiment of the present invention, with reference to FIGS. 5 and 6.

FIG. 5 shows a configuration of a previous amplifier circuit 31A according to the present embodiment. Note that components given the same reference numerals as those of the previous amplifier circuit 11A shown in FIG. 1 have the same functions as those of the previous amplifier circuit 11A. No particular description will be made on circuit configurations and connection relationships thereof.

The previous amplifier circuit 31A includes, in addition to the configuration of the previous amplifier circuit 11A, output circuits 3A and 3B (output changing circuit), each of which has the same configuration as the output circuit 3 of the previous amplifier circuit 11A. Further, in the previous amplifier circuit 31A, the output circuit 3 of the previous amplifier circuit 11A is replaced by an output circuit 3C. With the above configuration, the previous amplifier circuit 31A produces the same advantage as that produced by a previous amplifier circuit 21A, in a way different from the way the previous amplifier circuit 21A produces the advantage.

The output circuit 3A includes an NPN-type transistor Q6 and a constant-current source Isw1.

The output circuit 3B includes an NPN-type transistor Q7 and a constant-current source Isw2.

The output circuit 3C includes an NPN-type transistor Q4 and a constant-current source I1.

Bases of the transistors Q4, Q6, Q7 are connected one another, and connected to a collector of a transistor Q3. Collectors of the transistors Q4, Q6, Q7 are connected to a power supply Vcc. An emitter of the transistor Q4 is grounded via the constant-current source I1. An emitter of the transistor Q6 is grounded via the constant-current source Isw1. An emitter of the transistor Q7 is grounded via the constant-current source Isw2.

Further, a feedback resistor R31 and a feedback capacitor C31, which is connected parallel to the feedback resistor R31, are connected across a base of a transistor Q1 and a connection point of the constant-current source Isw1 and the emitter of the transistor Q6. A feedback resistor R32 and a feedback capacitor C32, which is connected parallel to the feedback resistor R32, are connected across a base of a transistor Q2 and a connection point of the constant-current source Isw2 and the emitter of the transistor Q7. A connection point of the constant-current source I1 and the emitter of the transistor Q4 is an output terminal Vo of the previous amplifier circuit 31A.

Only one of the output circuits 3A and 3B operates in response to a grounded emitter changing switch SW1. The following describes this in detail, with reference to FIG. 6.

FIG. 6 is a diagram showing a configuration of a previous amplifier circuit 31B. The figure shows a concrete and exemplary circuit of the constant-current sources Isw1 and Isw2 in the previous amplifier circuit 31A. Note that components given the same reference numerals as those of the previous amplifier circuit 11B shown in FIG. 2 have the same functions as those of the previous amplifier circuit 11B. No particular description will be made on circuit configurations and connection relationships thereof.

The constant-current sources Isw1 and Isw2 are configured with NPN-type transistors Q8 to Q15 and constant-current sources I3 to I6.

A base of the transistor Q8 is connected to the input terminal In of the CMOS inverter 10. A collector of the transistor Q8 is connected to a base of the transistor Q9 and a base of the transistor Q10. Further, the collector of the transistor Q8 is connected to the Vcc via the constant-current source I3.

A collector of the transistor Q9 is connected to a base of the transistor Q13. Further, the collector of the transistor Q9 is connected to the Vcc via the constant-current source I4. A collector of the transistor Q11 is connected to a collector of the transistor Q10 and a base of the transistor Q11. Further, the collector of the transistor Q11 is connected to the Vcc via the constant-current source I5. The base of the transistor Q11 is connected to a base of the transistor Q12. A collector of the transistor Q12 is connected to the emitter of the transistor Q6.

A collector of the transistor Q14 is connected to a collector of the transistor Q13 and a base of the transistor Q14. Further, the collector of the transistor Q14 is connected to the Vcc via the constant-current source I6. The base of the transistor Q14 is connected to a base of the transistor Q15. A collector of the transistor Q15 is connected to the emitter of the transistor Q7. Emitters of the transistors Q8 to Q15 are grounded.

In the case where DVD laser light is emitted from a two-wavelength laser diode 103, the input terminal In of the CMOS inverter 10 is supplied with a voltage of H level. This causes an MOS transistor Qsw1 to become ON. Further, an MOS transistor Qsw3 becomes OFF, and an MOS transistor Qsw4 becomes ON. As a result, an MOS transistor Qsw2 becomes OFF.

Further, the transistor Q8 becomes ON, and therefore a potential of the collector of the transistor Q8 decreases to a GND level. As a result, the respective transistors Q9 and Q10 become OFF. This causes current from the constant-current source I4 to flow into the base of the transistor Q13, and therefore the transistor Q13 becomes ON. As a result, all current from the constant-current source I6 flows into a GND via the transistor Q13. Thus, the output circuit 3B comes into a non-operating state.

At this time, the transistor Q10 is OFF, as described above. Therefore, the transistor Q6 is supplied with current coming from the constant-current source I5 via the transistors Q11 and Q12. As a result, the output circuit 3A comes into an operating state. With the foregoing operations, the grounded emitter amplifier circuit 1 becomes operable, and only the output circuit 3A for the grounded emitter amplifier circuit 1 (for photodiode PD1) comes into the operating state.

On the other hand, in the case where CD laser light is emitted from the two-wavelength laser diode 103, the input terminal In of the CMOS inverter 10 is supplied with a voltage of L level. This causes the MOS transistor Qsw1 to become OFF. Further, the MOS transistor Qsw3 becomes ON, and the MOS transistor Qsw4 becomes OFF. As a result, the MOS transistor Qsw2 becomes ON.

Further, the transistor Q8 becomes OFF. As a result, each of the transistors Q9 and Q10 becomes ON due to current coming from the constant-current source I3. When the transistor Q10 is ON, all current coming from the constant-current source I5 flows into the GND. Thus, the output circuit 3A comes into the non-operating state.

At this time, the transistor Q9 is ON, as described above. Therefore, all current coming from the constant-current source I4 flows into the GND, and therefore the transistor Q13 becomes OFF. As a result, current coming from the constant-current source I6 is supplied to the transistor Q7 via the transistors Q14 and Q15. Thus, the output circuit 3B comes into the operating state. With the foregoing operations, the grounded emitter amplifier circuit 1A becomes operable, and only the output circuit 3B for the grounded emitter amplifier circuit 1A (for photodiode PD2) comes into the operating state.

As described above, the previous amplifier circuit 31A includes the grounded emitter changing switch SW1 and the output circuits 3A and 3B. Only one of the output circuits 3A and 3B that is provided for the photodiode PD in operation becomes ON. Thus, even when unnecessary stray light is incident on a photodiode PD other than the photodiode PD that is in operation, it is possible to more assuredly feed only an output based upon current generated in a photodiode PD that is in operation than the previous amplifier circuit 11A does.

The respective previous amplifier circuits discussed in the respective embodiments are included, as the previous amplifier circuit 122 discussed in the description of the conventional technique, in a light-receiving amplifier circuit 121. Further, the light-receiving amplifier circuit 121 is included in a light receiving amplification element 110 of an optical pickup apparatus 101.

Accordingly, in the light-receiving amplifier circuit 121 including the respective previous amplifier circuits and in the optical pickup apparatus 101 including the light-receiving amplifier circuit 121, it is possible to keep the number of components constituting the circuits to a minimum. Furthermore, influence by unnecessary stray light is prevented.

Further, the respective previous amplifier circuits are configured with a grounded emitter amplifier circuit. Therefore, the light-receiving amplifier circuit 121 is excellent in response frequency characteristics, output offset voltage, and output noise characteristics. Accordingly, the light-receiving amplifier circuit 121 is significantly useful to be used as a light-receiving amplifier circuit of an optical pickup apparatus for high-speed reproduction/recording. Further, the optical pickup apparatus 101 is suitable to be used as an optical pickup apparatus for high-speed reproduction/recording.

Figure 9:
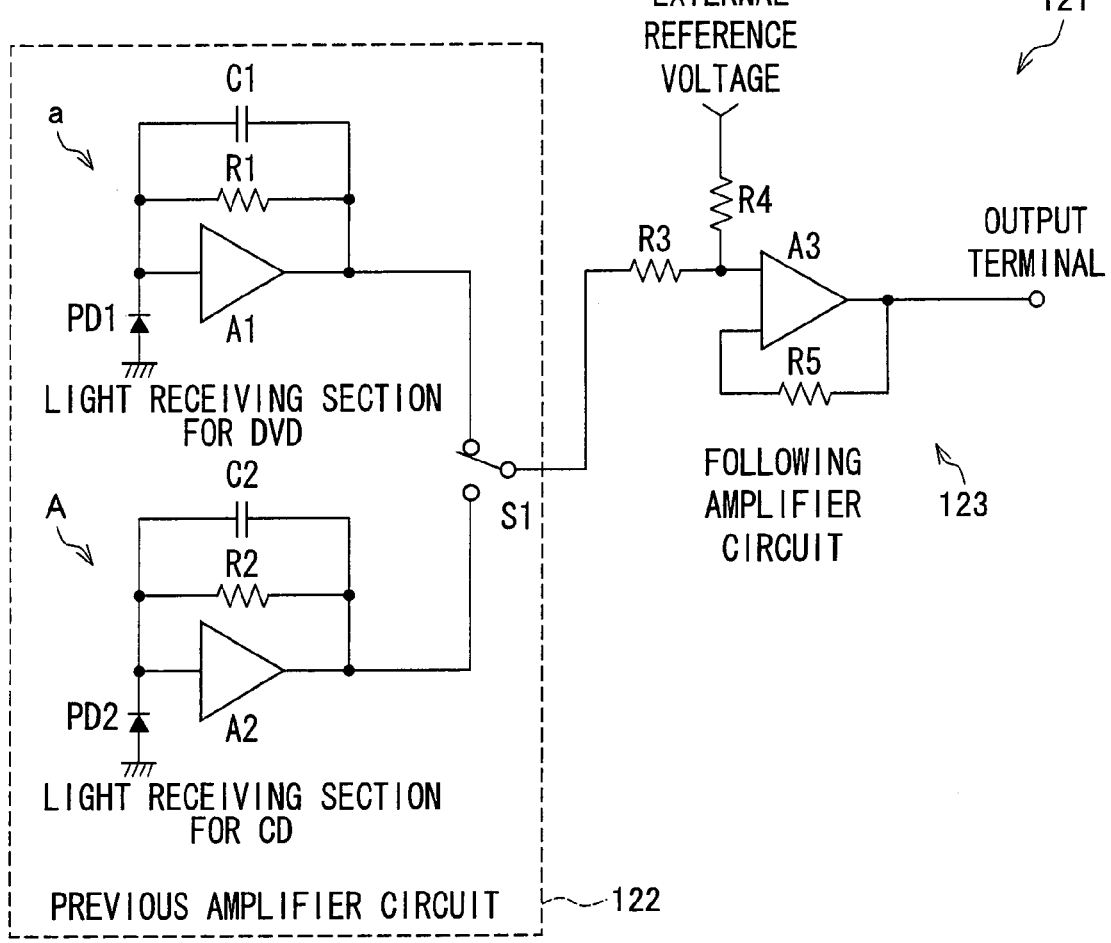
FIG. 9 is a circuit diagram illustrating a light-receiving amplifier circuit included in the light receiving amplification element.
Figure 10:
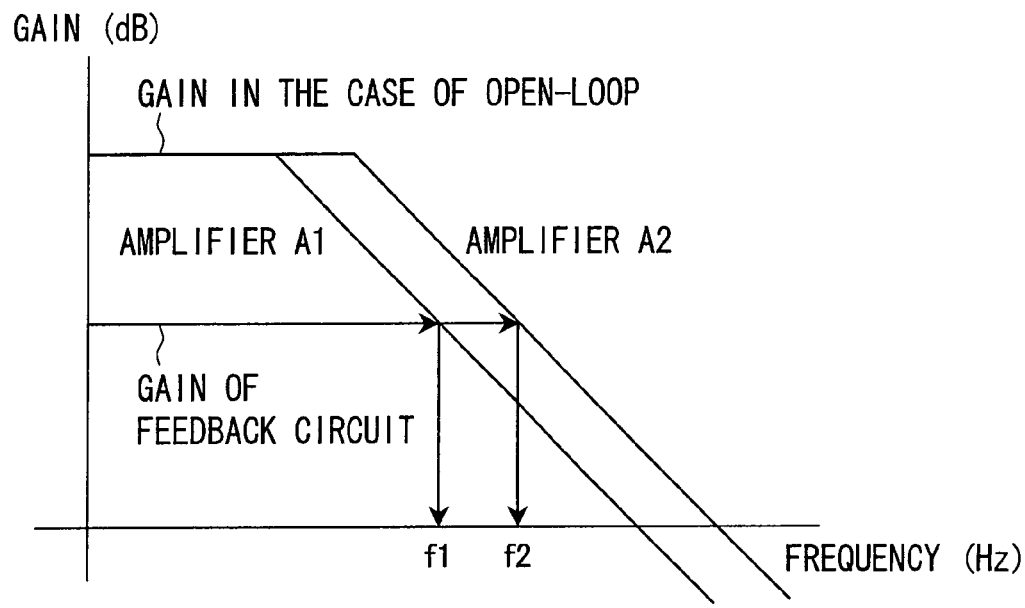
FIG. 10 is a diagram showing response frequency characteristics of an amplifier included in the light-receiving amplifier circuit.

Further, as described above, only the grounded emitter amplifier circuit 1 of the respective previous amplifier circuits operates in the case where DVD laser light is emitted from the two-wavelength laser diode 103, and only the grounded emitter amplifier circuit 1A operates in the case where CD laser light is emitted from the two-wavelength laser diode 103. Accordingly, the light-receiving amplifier circuit 121 does not have to include an output changing switch S1 shown in FIG. 9.

Further, the respective previous amplifier circuits are configured to be accommodated to the two-wavelength laser diode, but are not limited to the configurations. For example if a three-wavelength laser diode is developed in the future, it is possible to configure the respective previous amplifier circuits in a manner such that the respective previous amplifier circuits are accommodated to the three-wavelength laser diode.

The following describes an exemplary configuration of those previous amplifier circuits, using the previous amplifier circuit 11B as an example. The previous amplifier circuit 11B further includes: one photodiode; one grounded emitter transistor (grounded emitter amplifier circuit); one MOS transistor that is connected to an emitter of the grounded emitter transistor; one feedback resistor; and one feedback capacitor. Further, the CMOS inverter 10 is replaced by a circuit configured with three AND circuits and two inverters and including two input terminals and three output terminals. Note that the respective three output terminals are connected to the MOS transistor.

Operation performed in this configuration as follows. In response to laser light emitted from the laser diode, various combinations of an H voltage and a L voltage are supplied to an input terminal of the circuit provided in place of the CMOS inverter 10. This causes the circuit to produce an output to make one of the three MOS transistors operable.

The present invention is not limited to the description of the embodiments above, but may be altered by a skilled person within the scope of the claims. An embodiment based on a proper combination of technical means disclosed in different embodiments is encompassed in the technical scope of the present invention.

Meanwhile, for example in the case where the first switch is constituted of a mechanical switch, it is not possible to configured the previous amplifier circuit in the form of IC (integrated circuit).

Thus, it is preferable in a previous amplifier circuit according to the present embodiment that the first switch be an electrical switch.

In this configuration, the first switch is an electrical switch. This allows the previous amplifier circuit including the first switch to be configured in the form of IC. An exemplary electrical switch is the first switch configured with a MOS transistor.

It is preferable that the previous amplifier circuit according to the present embodiment further include: a second switch that is provided so as to change a connection between the plurality of light receiving devices and the plurality of grounded emitter amplifier circuits, and operates in a manner such that only the light receiving device on which the light signal is incident is connected to a grounded emitter amplifier circuit provided for the light receiving device on which the light signal is incident.

In the above configuration, the previous amplifier circuit includes the second switch. The second switch operates in a manner such that only a light receiving device on which the light signal is incident is connected to a grounded emitter amplifier circuit provided for the light receiving device.

In the case where two light receiving devices are provided, when a light signal is incident on the first light receiving device, the second switch operates in a manner such that the first light receiving device and the first grounded emitter amplifier circuit are connected. In other words, the second switch does not cause the second light receiving device and the second grounded emitter amplifier circuit to be connected.

This makes it possible to more assuredly produce only an output based upon the light signal than the configuration including only the first switch, even when unnecessary stray light is incident on a light receiving device other than the light receiving device on which the light signal is incident.

It is preferable in the previous amplifier circuit according to the present embodiment that each of the first switch and the second switch be an electrical switch.

In the above configuration, each of the first switch and the second switch is an electrical switch. This, in addition to the above advantages, allows the previous amplifier circuit including the first switch and the second switch to be configured in the form of IC. Exemplary electrical switches include the first switch and the second switch configured with MOS transistors, respectively.

It is preferable that the previous amplifier circuit according to the present embodiment further include a plurality of output changing circuits, each operating in the same manner as the output circuit only in an output changing circuit connected to the light receiving device on which the light signal is incident, the plurality of output changing circuits being provided one by one for the plurality of light receiving devices.

In the above configuration, the previous amplifier circuit includes the output changing circuits. One output changing circuit is provided for each of the light receiving devices, and only an output changing circuit connected to the light receiving device on which the light signal is incident operates in the same manner as the output circuit.

This is described below, using the case in which two light receiving devices are included. The output changing circuit connected to the first light receiving device is a first output changing circuit, and the output changing circuit connected to the second light receiving device is a second output changing circuit. The light signal is incident on the first light receiving device, and unnecessary stray light is incident on the second light receiving device.

In this case, only the first output changing circuit, out of the first and second output changing circuits, operates. Thus, the previous amplifier circuit including the first and second output changing circuits produces only an output based upon the light signal.

This makes it possible to more assuredly produce, in a different way from the configuration including the first and second switches, only an output based upon the light signal than the configuration including only the first switch, even when unnecessary stray light is incident on a light receiving device other than the light receiving device on which the light signal is incident.

The embodiments and concrete examples of implementation discussed in the foregoing detailed explanation serve solely to illustrate the technical details of the present invention, which should not be narrowly interpreted within the limits of such embodiments and concrete examples, but rather may be applied in many variations within the spirit of the present invention, provided such variations do not exceed the scope of the patent claims set forth below.

What is claimed is:

1. A previous amplifier circuit, comprising:
   a plurality of light receiving devices, each receiving a light signal, converting the light signal into current, and outputting the current, the light signal being incident on only one of the plurality of light receiving devices;
   a plurality of grounded emitter amplifier circuits, each amplifying, by use of a grounded emitter transistor, the current thus outputted and outputting the current thus amplified, the plurality of grounded emitter amplifier circuits being provided one by one for the plurality of light receiving devices;
   a first switch to be switched in a manner such that an emitter of a grounded emitter transistor connected to a light receiving device on which the light signal is incident is grounded so as to cause only one of the plurality of grounded emitter amplifier circuits to operate;
   an active load of the plurality of grounded emitter amplifier circuits; and
   an output circuit to receive an output of the plurality of grounded emitter amplifier circuits, and to produce an output by use of an emitter follower.

2. The circuit according to claim 1, wherein the first switch is an electrical switch.

3. The circuit according to claim 1, further comprising:
   a second switch that is provided so as to change a connection between the plurality of light receiving devices and the plurality of grounded emitter amplifier circuits, and operates in a manner such that only the light receiving device on which the light signal is incident is connected to a grounded emitter amplifier circuit provided for the light receiving device on which the light signal is incident.

4. The circuit according to claim 3, wherein each of the first switch and the second switch is an electrical switch.

5. The circuit according to claim 1, further comprising:
   a plurality of output changing circuits, each operating in the same manner as the output circuit only in an output changing circuit connected to the light receiving device on which the light signal is incident, the plurality of output changing circuits being provided one by one for the plurality of light receiving devices.

6. A light-receiving amplifier circuit, comprising:
   a previous amplifier circuit including:
      a plurality of light receiving devices, each receiving a light signal, converting the light signal into current, and outputting the current, the light signal being incident on only one of the plurality of light receiving devices;
      a plurality of grounded emitter amplifier circuits, each amplifying, by use of a grounded emitter transistor, the current thus outputted and outputting the current thus amplified, the plurality of grounded emitter amplifier circuits being provided one by one for the plurality of light receiving devices;
      a first switch to be switched in a manner such that an emitter of a grounded emitter transistor connected to a light receiving device on which the light signal is incident is grounded so as to cause only one of the plurality of grounded emitter amplifier circuits to operate;
      an active load of the plurality of grounded emitter amplifier circuits; and
      an output circuit to receive an output of the plurality of grounded emitter amplifier circuits, and to produce an output by use of an emitter follower.

7. The circuit according to claim 6, wherein the first switch is an electrical switch.

8. The circuit according to claim 6, wherein:
the previous amplifier circuit further includes:
- a second switch that is provided so as to change a connection between the plurality of light receiving devices and the plurality of grounded emitter amplifier circuits, and operates in a manner such that only the light receiving device on which the light signal is incident is connected to a grounded emitter amplifier circuit provided for the light receiving device on which the light signal is incident.

9. The circuit according to claim 8, wherein each of the first switch and the second switch is an electrical switch.

10. The circuit according to claim 6, wherein:
the previous amplifier circuit further includes:
- a plurality of output changing circuits, each operating in the same manner as the output circuit only in an output changing circuit connected to the light receiving device on which the light signal is incident, the plurality of output changing circuits being provided one by one for the plurality of light receiving devices.

11. An optical pickup apparatus, comprising:
a light-receiving amplifier circuit including:
a previous amplifier circuit including:
- a plurality of light receiving devices, each receiving a light signal, converting the light signal into current, and outputting the current, the light signal being incident on only one of the plurality of light receiving devices;
- a plurality of grounded emitter amplifier circuits, each amplifying, by use of a grounded emitter transistor, the current thus outputted and outputting the current thus amplified, the plurality of grounded emitter amplifier circuits being provided one by one for the plurality of light receiving devices;
- a first switch to be switched in a manner such that an emitter of a grounded emitter transistor connected to a light receiving device on which the light signal is incident is grounded so as to cause only one of the plurality of grounded emitter amplifier circuits to operate;
- an active load of the plurality of grounded emitter amplifier circuits; and
- an output circuit to receive an output of the plurality of grounded emitter amplifier circuits, and to produce an output by use of an emitter follower.

12. The apparatus according to claim 11, wherein the first switch is an electrical switch.

13. The apparatus according to claim 11, wherein:
the previous amplifier circuit further includes:
- a second switch that is provided so as to change a connection between the plurality of light receiving devices and the plurality of grounded emitter amplifier circuits, and operates in a manner such that only the light receiving device on which the light signal is incident is connected to a grounded emitter amplifier circuit provided for the light receiving device on which the light signal is incident.

14. The apparatus according to claim 13, wherein each of the first switch and the second switch is an electrical switch.

15. The apparatus according to claim 11, wherein:
the previous amplifier circuit further includes:
- a plurality of output changing circuits, each operating in the same manner as the output circuit only in an output changing circuit connected to the light receiving device on which the light signal is incident, the plurality of output changing circuits being provided one by one for the plurality of light receiving devices.

* * * * *